United States Patent [19]

Deibler et al.

[11] Patent Number: 5,484,074
[45] Date of Patent: Jan. 16, 1996

[54] METHOD FOR MANUFACTURING A SHADOW MASK

[75] Inventors: Dean T. Deibler, Cortland, N.Y.;
Thomas Ratz, Eschbach, Germany;
Peter L. Takach, Cortland, N.Y.;
Roland Thoms, Freiburg-Tiengen, Germany

[73] Assignee: BMC Industries, Inc., Minneapolis, Minn.

[21] Appl. No.: 237,501

[22] Filed: May 3, 1994

[51] Int. Cl.⁶ .................. B44C 1/22; C25F 3/00; C23F 1/02; B31D 3/00
[52] U.S. Cl. .................. 216/12; 216/40; 216/56; 216/92; 216/100
[58] Field of Search .................. 156/640, 644, 156/651, 654, 659.1, 661.1; 216/12, 40, 49, 56, 92, 100

[56] References Cited

U.S. PATENT DOCUMENTS

| | | | |
|---|---|---|---|
| 2,750,524 | 6/1956 | Braham | 156/644 X |
| 3,973,965 | 8/1976 | Suzuki et al. | 156/644 X |
| 4,303,466 | 12/1981 | Thoms | 156/626 |
| 4,357,196 | 11/1982 | Tanaka jket al. | 156/345 |
| 4,419,181 | 12/1983 | Tanaka et al. | 156/640 |
| 4,565,755 | 1/1986 | Ohtake et al. | 430/5 |
| 4,662,984 | 5/1987 | Ohtake et al. | 156/637 |
| 4,689,114 | 8/1987 | Ohtake et al. | 156/644 |
| 4,755,257 | 7/1988 | Yamamoto et al. | 156/631 |
| 4,861,422 | 8/1989 | Kudou et al. | 156/640 |
| 4,960,659 | 10/1990 | Sagou | 430/23 |
| 5,167,557 | 12/1992 | Teramoto et al. | 445/47 |
| 5,173,380 | 12/1992 | Kamon | 430/5 |
| 5,180,322 | 1/1993 | Yamamoto et al. | 445/37 |
| 5,200,025 | 4/1993 | Toei et al. | 156/640 |

Primary Examiner—William Powell
Attorney, Agent, or Firm—Kinney & Lange

[57] ABSTRACT

A method for manufacturing a shadow mask for use in a cathode ray tube includes providing a thin metal web having a first and second major surfaces. Photosensitive layers are formed on the first and second major surfaces. The first photosensitive layer is exposed to a first patterned light and the second photosensitive layer is exposed to a second patterned light. The exposure is continued until respective accumulated exposure of the photosensitive layers reaches a predetermined value. Next, a first protective film is applied to the second photosensitive layer to prevent etching of the second surface. The first surface is then etched to form a first cavity. The first cavity has a depth that is less than a distance from the first surface to the second surface. A second protective film is applied to the first surface to prevent additional etching of the first surface. Then the first protective film is removed and the second surface is etched to form a second cavity. The second cavity communicates with the first cavity. Finally, the second protective film and the photosensitive layers are removed.

8 Claims, 4 Drawing Sheets

METHOD FOR MANUFACTURING A SHADOW MASK

BACKGROUND OF THE INVENTION

The present invention relates to a method of forming a web with apertures. More particularly, the invention relates to a method of fabricating a shadow mask for use in a color cathode ray tube.

Cathode ray tubes are used in a variety of devices such as televisions and computer displays. The most important element in obtaining a high resolution cathode ray tube is producing a precisely etched shadow mask. It is generally recognized that a two-step etching process is needed for the successful manufacture of a uniformly etched, high resolution shadow mask. Two-step etching helps avoid the rapid and uncontrolled dimensional changes that occur when etched cavities intersect during simultaneous etching of both major surfaces during one-step etching.

The references that describe two-step etching indicate that the cavity formed in the first etching step should be completely filled before performing the second etching step. One such two-step method of fabricating a shadow mask is discussed in Kubo et al. U.S. Pat. No. 3,679,500. First, both sides of a web are coated with an etch resistant material. After the etch resistant material is patterned, a first side of the web is then etched to form a first cavity therein. Next, the first cavity is filled with an etch resistant material. Finally, the web is etched from a second side, opposite the first side, to form a second cavity that communicates with the first cavity to form an aperture.

Another two-step method of producing a shadow mask is described in Ohtake et al. U.S. Pat. No. 4,689,114. A web is oriented with a first surface up and the first surface of the web is then etched to form a cavity. Next, the web is flipped so that the first surface is now facing downward. An etch resistant layer is applied to the first surface and the second surface is etched until a cavity etched in the first surface communicates with the cavity etched in the first surface at a constricted portion. The method described in the Ohtake et al '114 patent attempts to completely fill the cavity in the first surface with the etch resistant layer.

Another attempt to increase the quality of shadow masks produced with a two-step etching process is disclosed in Toei et al. U.S. Pat. No. 5,200,025. The Toei et al. patent describes spraying a high pressure fluid at the web after the first etching step. The fluid removes the etch resistant material that overhangs a cavity etched during the first etching step. Then it is possible to more completely fill the cavity with etch resistant material before conducting the second etching step.

Rounding of the edges defining the cavity at the constriction point has been considered important in providing a shadow mask with excellent qualities. While one-step etching provides internal edge rounding, the overall qualities of a shadow mask produced using one-step etching has been deemed to be inferior to a shadow mask manufactured using a two-step etching process. One reference that addresses the need to achieve internal edge rounding in a multi-step etching process is Ohtake et al. U.S. Pat. No. 4,662,984. The method in the Ohtake et al. '984 patent is similar to the method in the Ohtake et al. '114 patent. However, after stripping the etch resistant material from the etched web, this method includes an additional etching step. In this step, etching solution is sprayed at both sides of the web to round the edges defining the cavities at the constriction point.

SUMMARY OF THE INVENTION

The present invention includes a method for manufacturing a shadow mask for use in a cathode ray tube. The method includes providing a thin metal web having a first and second major surface. Photosensitive layers are then formed on the first and second major surfaces. Next, the first photosensitive layer is exposed to a first patterned light and the second photosensitive layer is exposed to a second patterned light. The exposure is continued until respective accumulated exposure of the photosensitive layers reaches a predetermined value. A first protective film is applied to the second photosensitive layer to prevent etching of the second surface. The first surface is then etched to form a first cavity. The first cavity has a depth that is less than a distance from the first surface to the second surface. A second protective film is applied to the first surface to prevent additional etching of the first surface. The first protective film is removed and the second surface is etched to form a second cavity. The second cavity communicates with the first cavity. Finally, the second protective film and the photosensitive layers are removed.

DETAILED DESCRIPTION OF THE PREFERRED EMBODIMENTS

Figure 1:
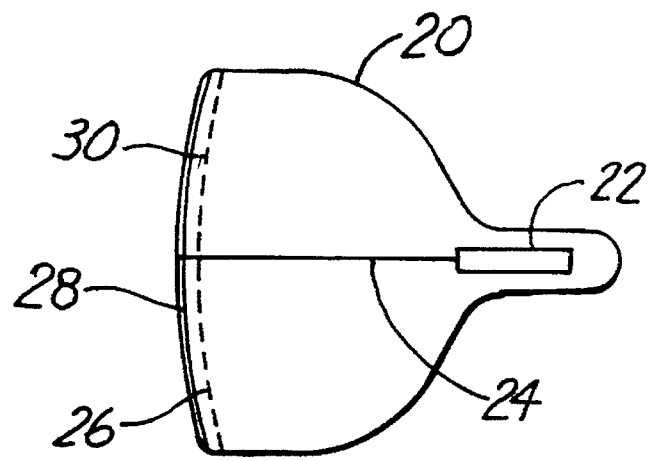
FIG. 1 is a sectional view of a prior art cathode ray tube.

As illustrated in FIG. 1, the cathode ray tube 20 includes an electron gun 22 for producing an electron beam 24, a shadow mask 26 for selectively passing the electron beam 24, and phosphor dots 28 for receiving a plurality of electron beams 24 that pass through the shadow mask 26 and for emitting light in one of the three primary colors.

Figure 2:
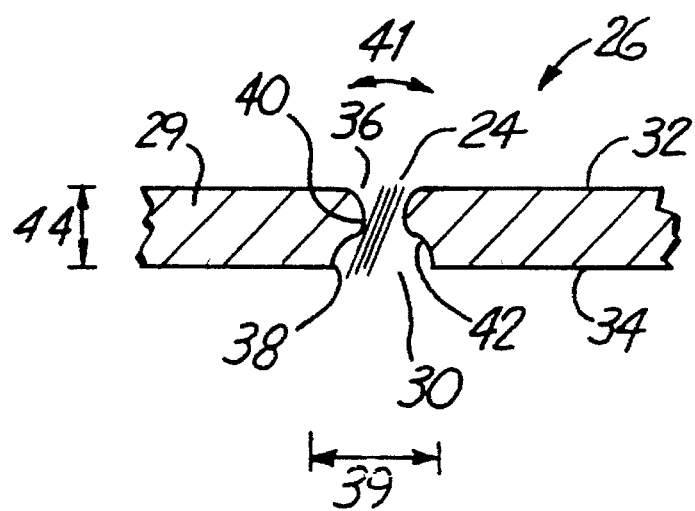
FIG. 2 is a sectional view of a prior art shadow mask for the cathode ray tube illustrated in FIG. 1.

A sectional view of the shadow mask 26 is illustrated in FIG. 2. The shadow mask 26 is fabricated from a web 29. The web 29 has a plurality of apertures 30. The placement and shape of the apertures in the web 29 are carefully designed so that when the web 29 is used as a shadow mask in a cathode ray tube, high definition pictures can be produced. Electron beams are directed through the apertures 30 so that the only electron beams 24 that can pass through the shadow mask 26 are the electron beams that accurately strike the phosphor dots.

The web 29 includes a first major side 32 and a second major side 34, oriented opposite the first major side 32. The first major side 32 preferably oriented towards the electron gun is the grade side. The second major side 34 preferably oriented towards the phosphor screen is the cone side.

The aperture 30 extends from the grade side 32 to the cone side 34. The grade side 32 has a grade side cavity 36 formed therein and the cone side 34 has a cone side cavity 38 formed therein. A width 39 of the grade side cavity 36 is greater than a width 41 of the cone side cavity 38. The grade side cavity 36 and the cone side cavity 38 communicate at a constricted portion 40.

A width of the aperture 30 at the constricted portion 40 determines the size of the electron beam 24 that can be projected on the phosphor dots. If the position or size of the grade side cavity 36, the cone side cavity 38, or the constricted portion 40 is changed within the web 29, the picture quality of the cathode ray tube will be deteriorated. In addition, if the electron beam 24 hits the inner wall 42 of the grade side cavity 36 or cone side cavity 38, reflected electron beams will cause the picture quality to be deteriorated.

To shape the aperture 30 in the web 29, photolithography is typically used. However, the photolithography is complicated because the thickness 44 of the web 29 is greater than the diameter of the constricted portion 40 of the aperture 30. Conventional one-step etching techniques produce irregular results when used to form this type of aperture 30 in the web 29. Frequently, one-step etching techniques result in overetching of the web. The etching process is complicated even more by the fact that it is preferable to perform the etching in a continuous production manner.

Figure 3:
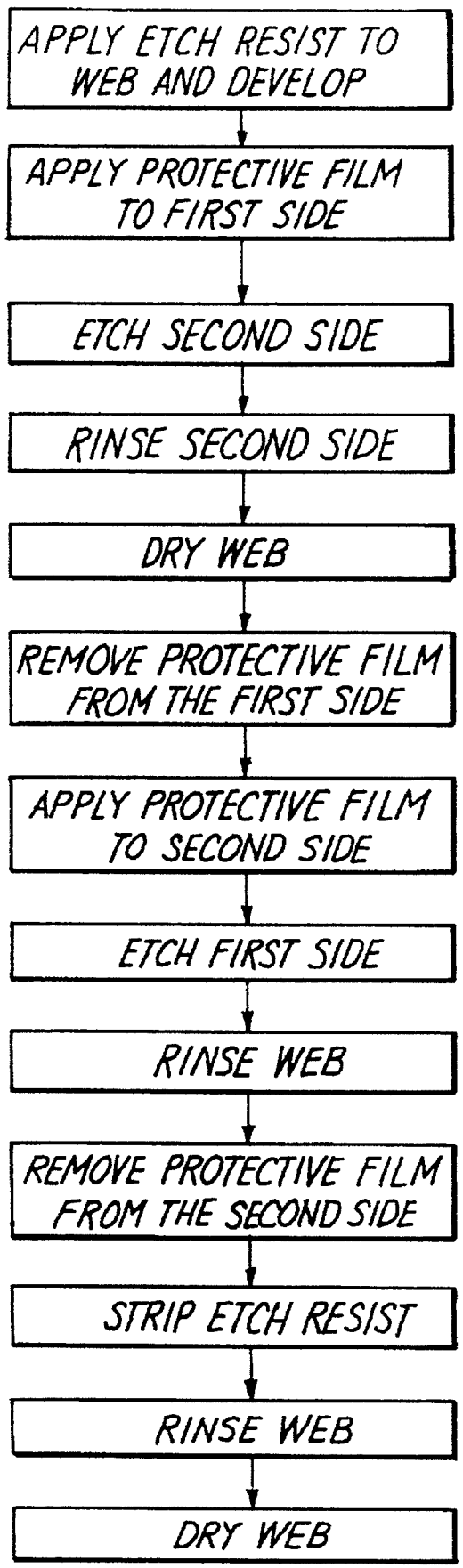
FIG. 3 is a flow chart indicating the shadow mask fabrication process of the present invention.

The method of forming a shadow mask according to the present invention is generally illustrated in the flow chart in FIG. 3. Steps in the application of the method to the web 29 are illustrated in FIGS. 4A–H.

While the Figures illustrate the grade side 32 is oriented in an upward direction, the orientation of the grade side 32 is not a critical element of the invention. Accordingly, the grade side 32 may be oriented in a downward direction or at an angle between vertical and horizontal.

The web 29 is preferably a ferric nickel alloy. The web 29 may be constructed from other materials, such as low carbon aluminum killed steel, that are known in the art. The web 29 is first cleaned by passing it through a tank containing a caustic solution. Next, the web 29 is rinsed with deionized water to remove the caustic solution.

Figure 4A:
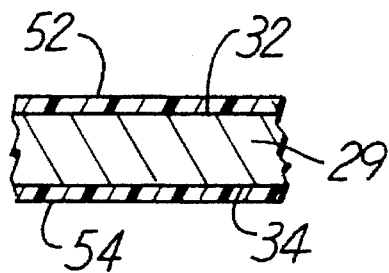
FIGS. 4A–H are sectional views of a shadow mask for a cathode ray tube at different stages of the manufacturing process.

As illustrated in FIG. 4A, a photosensitive resin is applied to the web 29 to form photosensitive layers 52, 54 on the grade side 32 and the cone side 34, respectively. The photosensitive layers 52, 54 are preferably formed from a water soluble casein based material. However, one of ordinary skill in the art would readily appreciate that other materials could be used to produce photosensitive layers.

A first negative film (not illustrated) and a second negative film (not illustrated) are then positioned proximate to the grade side photosensitive layer 52 and cone side photosensitive layer 54, respectively. The first and second negative films have patterns that correspond to the pattern that is desired to be etched into the web 29.

Figure 4B:
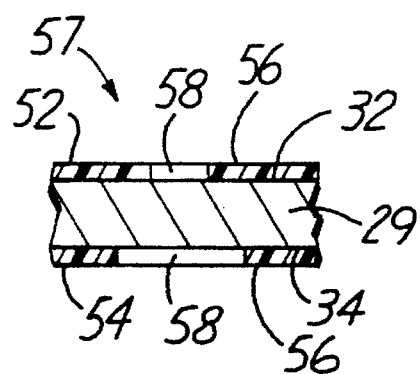

Next, the photosensitive layers 52, 54 are exposed to a light source (not illustrated). The light source is preferably an ultraviolet light. The ultraviolet light causes solidified regions 56 to form in portions of the photosensitive layers 52, 54 that are not covered by the negative film. Unexposed portions 58 of the photosensitive layers 52, 54, which are covered by the negative film, do not solidify. The web with exposed photosensitive layers 57 is illustrated in FIG. 4B. The exposed web 29 is then baked in an oven at a temperature of at least 200° C. until the photosensitive layers are cured.

Figure 4C:
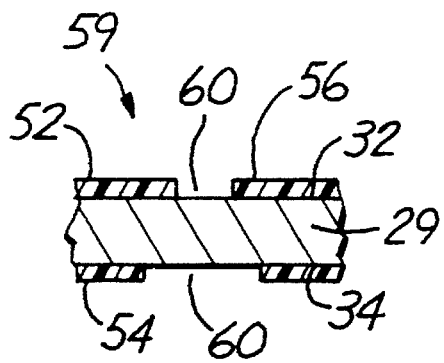

The photosensitive layers 52, 54 are then sprayed with water. The water causes the unexposed portions 58 of the photosensitive layers 52, 54 to dissolve. A cross section of the web with patterned photosensitive layers 59 is shown in FIG. 4C.

Figure 4D:
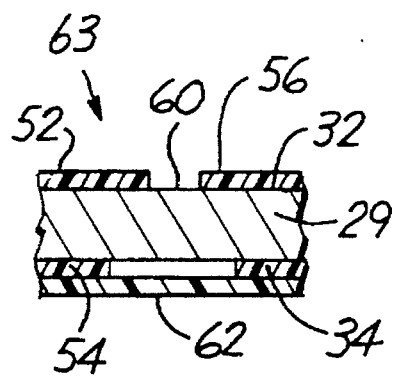

A polymer based protective film 62 is then applied to the cone side 34 to prevent etching of the cone side 34. The protective film 62 is preferably polymer based so that it is not affected by the etching solution. A cross sectional view of the protected, unetched web 63 is illustrated in FIG. 4D.

Figure 4E:
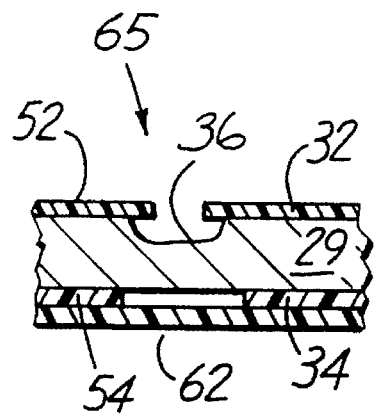

A ferric chloride etching solution is now sprayed at the web 29 to etch the grade side 32. The etching solution causes a grade side cavity 36 to be etched into the web 29. The etching is continued until the grade side cavity 36 reaches a desired depth. Once the etching is complete, the web 29 is rinsed with deionized water to remove remaining etching solution. A cross sectional view of the partially etched web 65 is illustrated in FIG. 4E.

While the grade side 32 is etched prior to the cone side 34 in the description of the present invetion, the order in which the sides are etched is not critical to forming a precisely etched web. As a result, the cone side 34 may be etched prior to the grade side 32.

At this stage, the grade side photosensitive layer 52 may be removed by spraying water at the web 29. The web 29 is now dried by baking in an oven. Alternatively, the grade side photosensitive layer 52 may be removed after the second etching step when the cone side photosensitive layer 54 is removed.

Figure 4F:
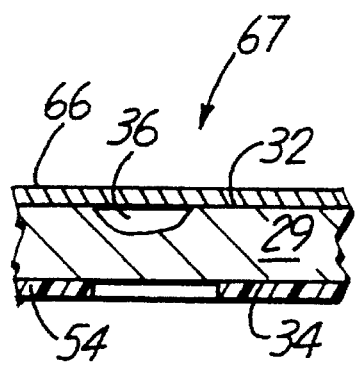

The cone side protective film 62 is removed from the cone side 34 to reveal the patterned cone side photosensitive layer 54. A polymer based protective film 66 is now applied to the grade side 32 of the web 29. The grade side protective film 66 prevents additional etching of the grade side 32. A cross-sectional view of the protected, partially etched web 67 is illustrated in FIG. 4F.

Figure 4G:
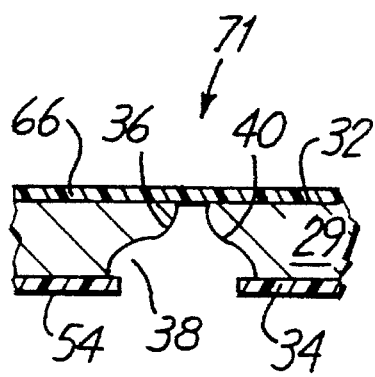

Ferric chloride etching solution is then sprayed at the web 29. The etching solution etches a cavity 38 in the cone side 34 of the web 29. Etching is continued until the cone side cavity 38 obtains a desired depth. The grade side cavity 36 and the cone side cavity 38 now communicate at a constricted portion 40. A cross-sectional view of the protected, etched web 71 is illustrated in FIG. 4G.

Because the grade side cavity 36 was not filled with an etch resistant material during the second etching step, the etching solution affected a rounding of the constricted portion 40. Rounding of the constricted portion 40 allows the web 29 to produce a more precise image when the web 29 is incorporated into a cathode ray tube.

Rounding of the constricted portion 40 as obtained by the process of the present invention enables the shadow mask to produce a higher quality image than was available using prior two-step etching methods. In addition, the process of the present invention obtains rounding of the constricted portion 40 without the necessity of performing a third etching step.

Figure 4H:
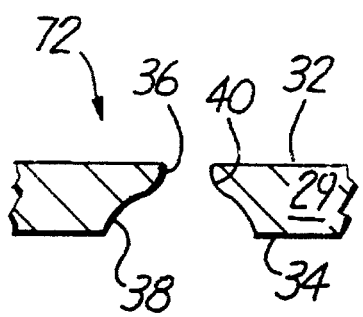

Next, the grade side protective film 66 is removed from the grade side 32. A stripping solution is sprayed at the web 29 to remove the photosensitive material 54 from the cone side 34. The stripping solution is preferably water. The web 29 is then rinsed with deionized water to remove any remaining stripping solution. Finally, the etched web 29, which is illustrated in FIG. 4H, is heated in an oven to dry the etched web. The etched web 72 is now ready for cutting into pieces which can be used to form shadow masks for use in cathode ray tubes.

Although the present invention has been described with reference to preferred embodiments, workers skilled in the art will recognize that changes may be made in form and detail without departing from the spirit and scope of the invention.

What is claimed is:

1. A method for manufacturing a shadow mask for use in a cathode ray tube, the method comprising the steps of:

providing a thin metal web having a first and second major surfaces;

forming photosensitive layers on the first and second major surfaces;

exposing the first photosensitive layer to a first patterned light and the second photosensitive layer to a second patterned light;

applying a first protective film on the second photosensitive layer to prevent etching of the second surface;

etching the first surface to create a first cavity, the first cavity having a depth that is less than a distance from the first surface to the second surface;

applying a second protective film to the first surface to prevent additional etching of the first surface;

removing the first protective film;

etching the second surface to create a second cavity, the second cavity communicating with the first cavity;

removing the second protective film; and removing the photosensitive layers.

2. The method of claim 1 and further comprising the step of removing of the first photosensitive layer before applying a second protective film to the first surface.

3. The method of claim 1, wherein a thickness of the metal web is in the range of 0.1 millimeters to 0.3 millimeters.

4. The method of claim 3, wherein the material of the metal web is a ferric nickel alloy.

5. The method of claim 3, wherein the material of the metal web is low carbon aluminum killed steel.

6. The method of claim 1, wherein the photosensitive layers are formed from a water soluble casein material.

7. The method of claim 1, wherein an ultraviolet light is patterned to produce the first patterned light and the second patterned light.

8. The method of claim 1, wherein the etching is accomplished using a ferric chloride etching solution.

* * * * *